(12) United States Patent
Van Den Boom

(10) Patent No.: US 8,729,636 B2
(45) Date of Patent: May 20, 2014

(54) INTEGRATED CIRCUIT AND METHOD FOR MANUFACTURING AN INTEGRATED CIRCUIT

(75) Inventor: Jeroen Van Den Boom, Horssen (NL)

(73) Assignee: NXP B.V., Eindhoven (NL)

( * ) Notice: Subject to any disclaimer, the term of this patent is extended or adjusted under 35 U.S.C. 154(b) by 723 days.

(21) Appl. No.: 13/055,790

(22) PCT Filed: Jul. 28, 2009

(86) PCT No.: PCT/IB2009/053272
§ 371 (c)(1),
(2), (4) Date: Jan. 25, 2011

(87) PCT Pub. No.: WO2010/013195
PCT Pub. Date: Feb. 4, 2010

(65) Prior Publication Data
US 2011/0115029 A1    May 19, 2011

(30) Foreign Application Priority Data

Jul. 28, 2008  (EP) .................................... 08161258

(51) Int. Cl.
*H01L 21/70*    (2006.01)
(52) U.S. Cl.
USPC ............ 257/369; 257/E27.062; 257/E21.575; 438/618
(58) Field of Classification Search
USPC ............ 257/369, E27.062, E21.575; 438/618
See application file for complete search history.

(56) References Cited

U.S. PATENT DOCUMENTS

| | | |
|---|---|---|
| 6,713,823 B1 | 3/2004 | Nickel |
| 6,946,706 B1 | 9/2005 | Brisbin et al. |
| 7,355,217 B1 | 4/2008 | Brand |
| 2003/0209759 A1 | 11/2003 | Blanchard |
| 2005/0250300 A1 | 11/2005 | Fong |
| 2006/0238241 A1 | 10/2006 | Pearce et al. |

FOREIGN PATENT DOCUMENTS

| | | |
|---|---|---|
| JP | S63 204655 A | 8/1988 |
| JP | 2006 261437 A | 9/2006 |
| JP | 2008 078469 A | 4/2008 |
| WO | 2005008891 A2 | 1/2005 |

OTHER PUBLICATIONS

Nassif-Khalil, S. G., et al; "Low Voltage CMOS Compatible Power MOSFET for On-Chip DC/DC Converters"; Proceedings From 12th Intl Symp on Power Semiconductor Devices and IC's; Toulouse, France; IEEE, NY, NY, US; p. 43-46 (May 22, 2000).
Brisbin, "Hot Carrier Reliability of N-LDMOS Transistors for Power BICMOS Applications" (2002).
International Search Report and Written Opinion for Application PCT/IB2009/053272 (Nov. 26, 2009).

*Primary Examiner* — Colleen Matthews
*Assistant Examiner* — Colleen E Snow

(57) ABSTRACT

Integrated circuit comprising a substrate carrying at least one transistor comprising an alternating grid (1) of source and drain regions (D, S) separated by a grid (14) of gate regions, e.g. a checkerboard pattern of source and drain regions. The source regions (S) are vertically connected to a first metal layer and the drain regions (D) are vertically connected to a second metal layer. At least one of the first metal layer and the second metal layer comprises a metal grid (30, 40) of a plurality of interconnected metal portions (32, 42) arranged such that said grid comprises a plurality of gaps (34, 44) for connecting respective substrate portions to a further metal layer. Method for manufacturing such an integrated circuit.

13 Claims, 6 Drawing Sheets

Figure 1:
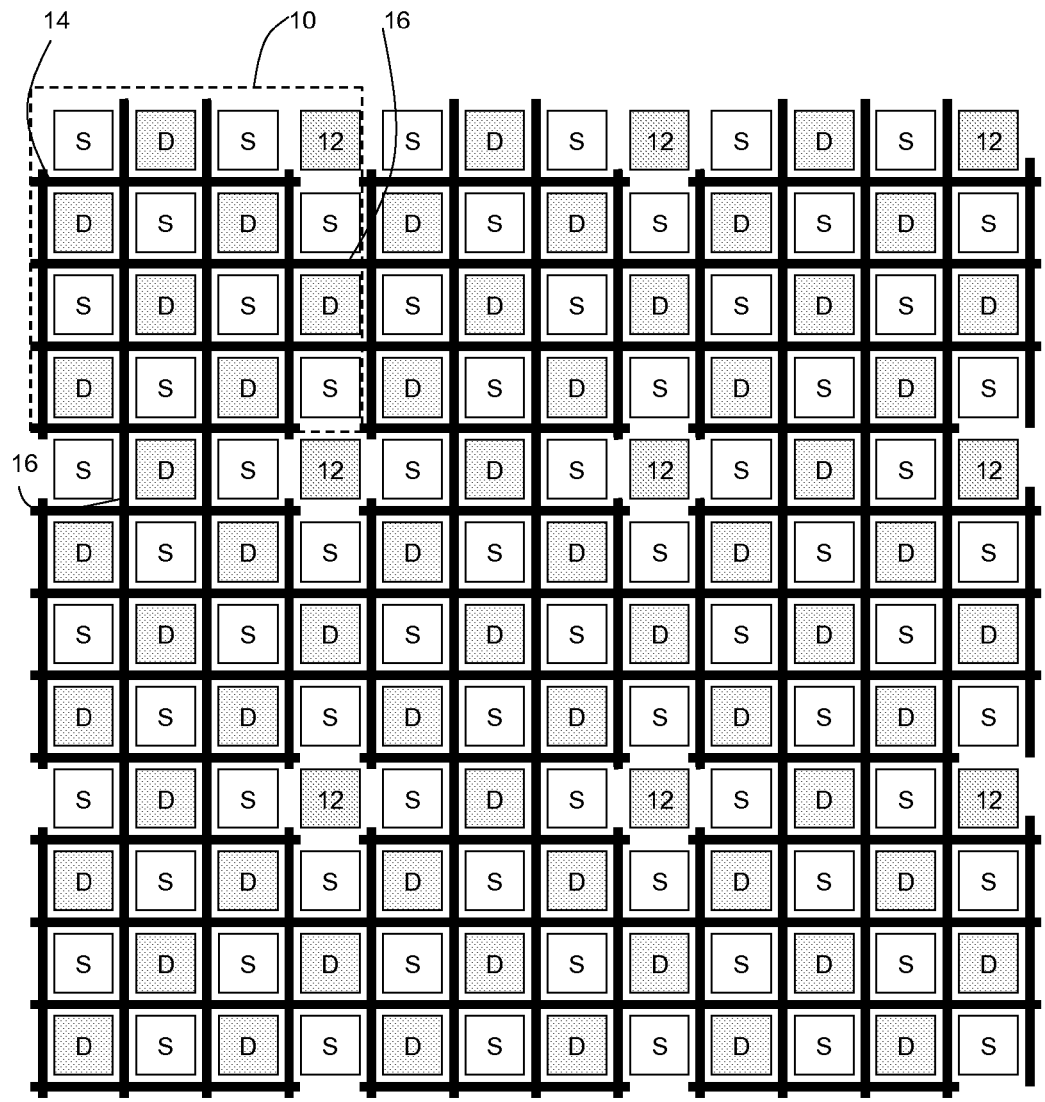

INTEGRATED CIRCUIT AND METHOD FOR MANUFACTURING AN INTEGRATED CIRCUIT

FIELD OF THE INVENTION

The present invention relates to an integrated circuit (IC) having at least one transistor, said transistor comprising a grid of unit cells including source and drain regions separated by a grid of gate regions.

The present invention further related to manufacturing such an IC.

BACKGROUND OF THE INVENTION

The downscaling of the dimensions of ICs such as CMOS ICs continually poses IC designers with difficult design challenges, not in the least because the reduction in feature size is usually accompanied by a demand for the integration of a higher number of components in the IC. Typically, this makes it increasingly difficult to ensure that all semiconductor components of the IC can be properly connected to the metal layers of the IC. In addition, the reduction of the feature size of a building block of the IC such as a transistor must be achieved whilst ensuring that the performance of the transistor or at least the overall performance of the IC is not adversely affected. It will be obvious that the above challenges are by no means trivial.

For instance, it is difficult to achieve a compact power transistor, since such a transistor typically has to provide a high power output, for which a low-resistive channel is required. This may be achieved by increasing the dimensions of the channel and by placing strips of the source (S), drain (D) and channel (C) regions in parallel in an interdigited fashion, e.g. SCDCSCDC . . . . However, such a layout is not particularly area-efficient and requires interdigited metal structures for connecting these transistor regions, which cannot be automatically routed due to their complexity, thus adding to the complexity and cost of the design.

An improved layout is disclosed in US 2006/0238241. This patent application discloses a QVDMOS transistor comprising a checkerboard pattern of source and drain regions, wherein the source and drain regions are separated from each other by a grid of gate regions. This improves the effective channel width of the transistor, but complicates the interconnection of the transistor regions to the metal layers of the IC, as indicated in US 2006/0238241. Moreover, a further problem is that the area-efficient checkerboard layout of the source and drain regions makes it more difficult to provide additional contacts to the substrate. This is particularly relevant in CMOS technology where contacts to the substrate are required to prevent latch-up. Additional contacts may be provided in the periphery of the transistor but this has the disadvantage that a relatively large number of contacts is required to provide satisfactory protection against latch-up, thereby off-setting the area gains achieved by the checkerboard layout.

SUMMARY OF THE INVENTION

The present invention seeks to provide an IC that overcomes at least some of the aforementioned problems.

The present invention further seeks to provide a method of manufacturing such an IC.

According to an aspect of the present invention, there is provided an IC comprising a substrate carrying at least one transistor comprising an alternating grid of source and drain regions separated by a grid of gate regions, wherein the respective source regions are vertically connected to a first metal layer and the respective drain regions are vertically connected to a second metal layer, at least one of the first metal layer and the second metal layer comprising a metal grid having a plurality of partially interconnected metal portions arranged such that said metal grid comprises a plurality of gaps for connecting respective substrate portions to a further metal layer.

Such an IC has the advantage that the higher metal layers can be connected to lower metal layers or structures in the substrate through the periodic gaps between the partially overlapping rectangular metal portions, which facilitates the interconnection of the alternating source and drain regions. In the context of the present invention, the term substrate may refer to a common chip substrate, an epitaxial layer on top of the common chip substrate or a local p-well embedded in an n-well, e.g. a triple well technology.

In a preferred embodiment, the alternating grid comprises a plurality of unit cells, each unit cell comprising a grid of N building blocks, N being an integer having a value of at least four, said N building blocks comprising a single substrate contact and (N−1) source and drain regions, the source and drain regions of the unit cells being separated by at least a part of the grid of gate regions.

In such an IC, the connections to the substrate are included in the checkerboard pattern defined by the building blocks of the unit cells such that no additional substrate contacts in the periphery of the transistor layout are required. This has the further advantage that fewer contacts are required because the regularity of the substrate contacts in the grid provides a more efficient way of connecting the substrate. Hence, in case of a CMOS IC, a very efficient latch-up protection may be provided by the substrate contacts in the unit cells. To this end, the size of the unit cell, i.e. the value of N, may be chosen in accordance with the required number of substrate contacts to provide effective latch-up protection. The number of substrate contacts may be determined using appropriate simulation models and/or experimental data. This way, the number of substrate contacts may be kept to the minimum number of contacts required, thus reducing the area overhead and cost of the IC.

It will however be appreciated that the present invention is not limited to CMOS ICs and that the substrate contacts may be used for other purposes than latch-up protection, such as for the provision of a back bias to a particular part of the substrate.

In an embodiment, there is a difference of one between the total number of source regions and the total number of drain regions per unit cell. For instance, each unit cell may comprise (N/2) source regions and (N/2−1) drain regions. This provides the most area-efficient layout for the transistor in terms of performance and effective gate width.

In case of a CMOS IC, the substrate contact may provide a direct contact to the p-type substrate for an nMOS transistor. Alternatively, the substrate may comprise a plurality of n-wells, wherein the substrate contact of each unit cell is connected to one of said n-wells. This would provide a latch-up protection arrangement for pMOS transistor.

Preferably, at least one of the first metal layer and the second metal layer comprises a plurality of partially overlapping rectangular metal portions arranged such that said metal layer comprises a plurality of gaps for connecting the substrate contacts to a further metal layer. The provision of periodic gaps or openings in the metal grid(s) facilitates the connection of the substrate contacts to higher metal layers in a straightforward manner, thus reducing the cost of manufacturing the IC.

In an embodiment, each rectangular metal portion has an area and shape substantially similar to a corresponding source or drain region. This means that the first metal grid and the second metal grid can be stacked on top of each other with the rectangular portions of the upper metal grid connecting to the corresponding regions in the substrate through the gaps in the lower of the two metal grids. It is pointed out that in the context of the present invention, the phrase 'rectangular' includes square shapes.

The use of the metal grids of the present invention further facilitates the connection of these grids to the highest metal layers of the IC, which are typically low-ohmic, for instance to provide a good conductive external connection. In particular, the IC may comprise a first low-ohmic metal layer conductively coupled to the first metal grid through at least one stacked via, and/or a second low-ohmic metal layer conductively coupled to the second metal grid through at least one stacked via. This is an important advantage, because in contrast to prior art ICs using strip-based interconnects, which could not be connected using stacked vias because the via size would be too large to allow connection to the small sized metal strips, the rectangular portions provide a sufficiently large area for receiving such a stacked via.

The present invention is particularly advantageous when the at least one transistor is a power transistor, because the dimensions of a power transistor are typically governed by the power requirements of the transistor (this is less the case for transistors in e.g. digital logic circuits). Hence, the size of a power transistor can be significantly reduced by the transistor layout of the present invention.

The IC of the present invention may be integrated in an electronic device, such as linear (class AB) audio power amplifiers, switching (class D) audio power amplifiers, linear voltage regulators, switching voltage (power) converters, HF and RF amplifiers, and line drivers for buses and cables. It is particularly advantageous if the electronic device itself is small, e.g. a hand-held device such as a mobile communications device, because the size reduction achieved in the IC of the present invention frees valuable additional real estate for the electronic device to be used for other functionality. More importantly, the size reduction facilitates the manufacture of a reduced cost IC because the cost of an IC scales with its area, thus reducing the cost of the electronic device including the IC. This is an important advantage because competition in the consumer electronics market is high, such that manufacturing cost reduction play an important part is improving a market position.

According to another aspect of the present invention, there is provided a method of manufacturing integrated circuit comprising at least one transistor formed on a substrate, said method comprising providing a substrate carrying at least one transistor comprising an alternating grid of source and drain regions separated by a grid of gate regions, providing a first metal layer such that the respective source regions are vertically connected to the first metal layer; providing a second metal grid such that the respective drain regions are vertically connected to the second metal layer, wherein at least one of the first metal layer and the second metal layer comprises a metal grid having a plurality of interconnected metal portions arranged such that said metal grid comprises a plurality of gaps for connecting respective substrate portions to a further metal layer.

The provision of at least one metal grid comprising such a plurality of partially overlapping rectangular metal portions facilitates the formation of metal to metal or metal to substrate interconnections, as previously explained.

In a preferred embodiment, the step of providing the substrate comprises providing a grid of unit cells on said substrate, each unit cell comprising a grid of N building blocks, N being an integer having a value of at least four, said N building blocks comprising a single substrate contact and (N−1) source and drain regions, the source and drain regions of the unit cells being separated by at least a part of the grid of gate regions. This provides an IC having a reduced footprint, as previously explained.

BRIEF DESCRIPTION OF THE EMBODIMENTS

Figure 2:
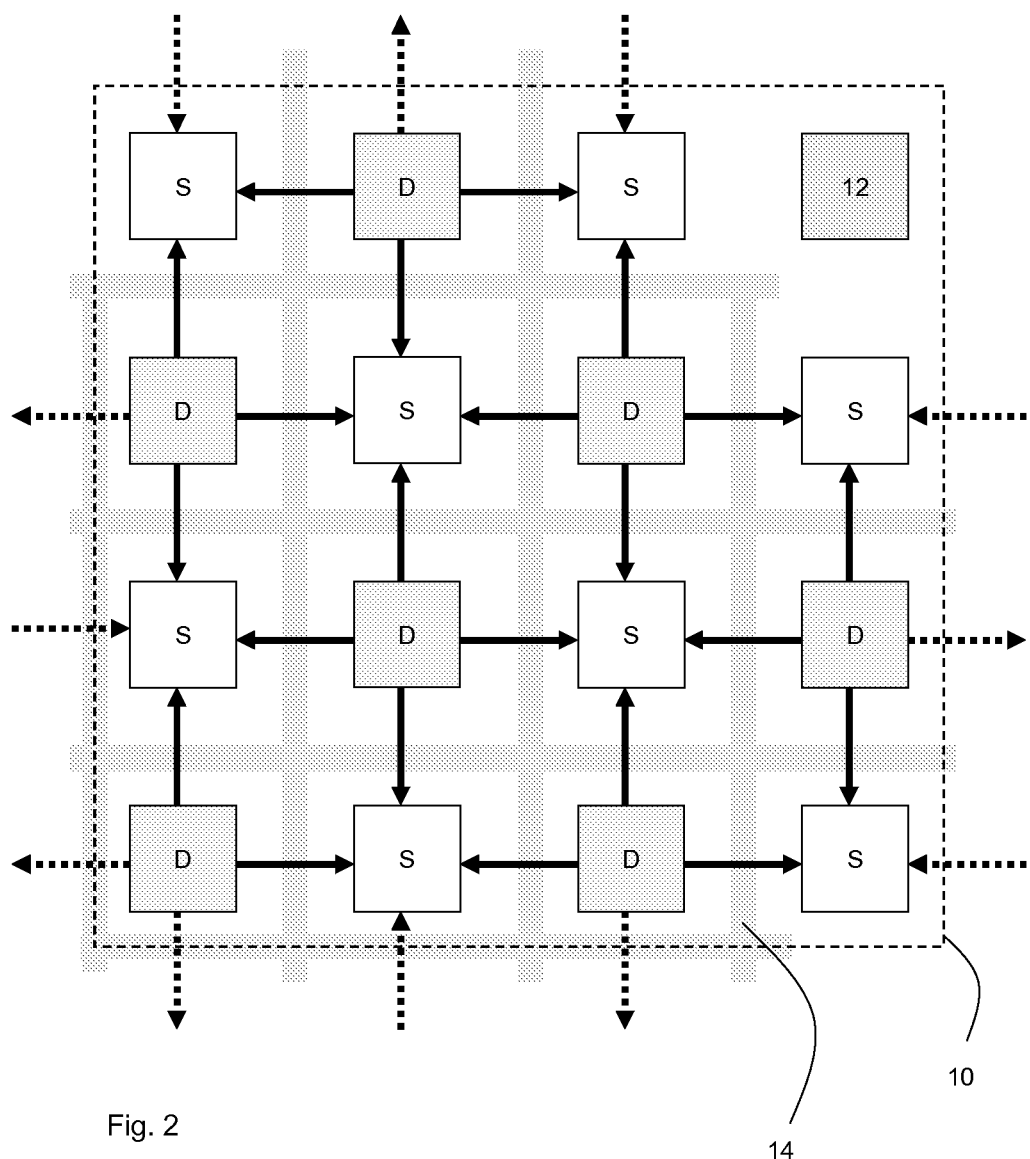
Figure 3:
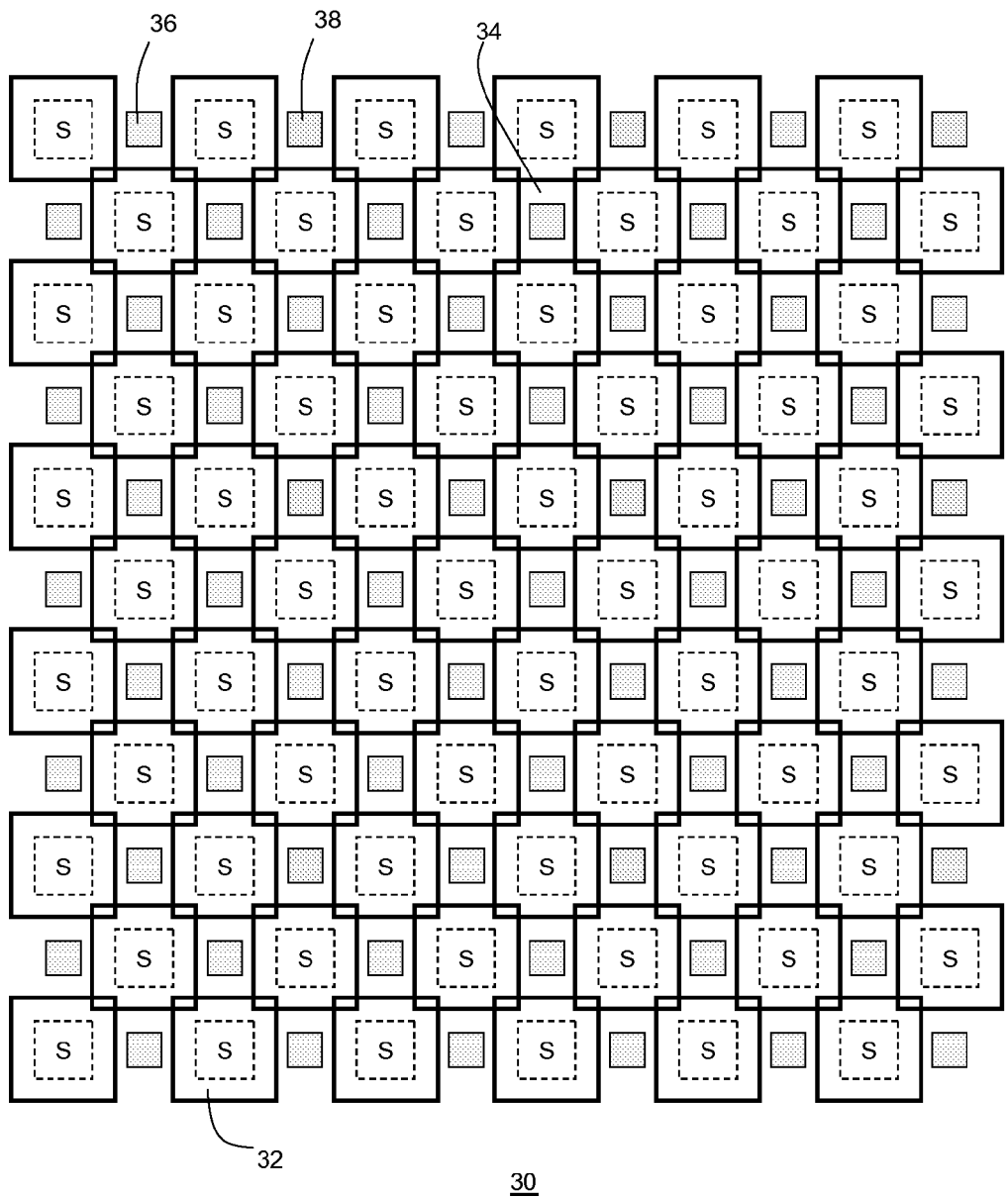
Figure 4:
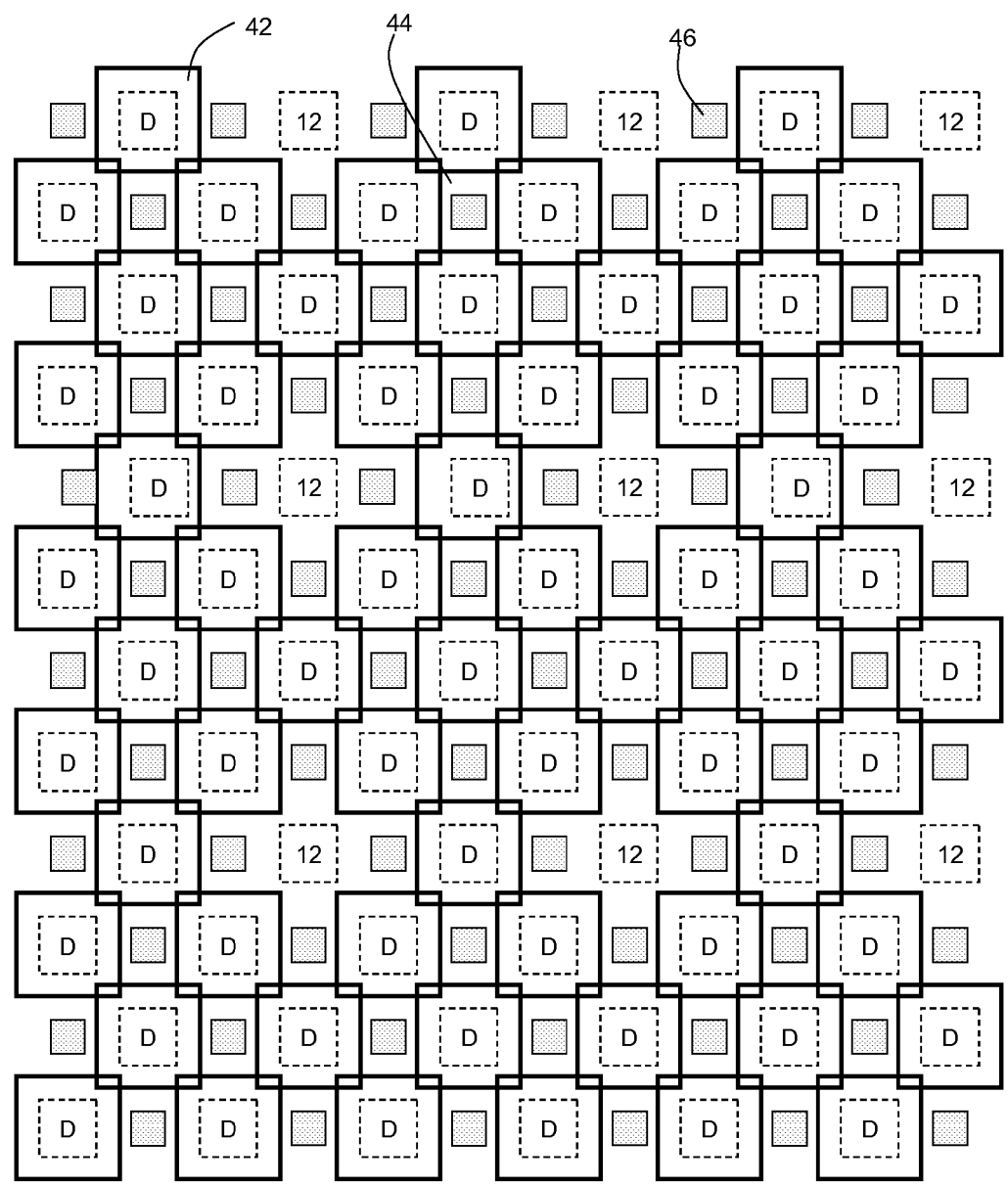
Figure 5:
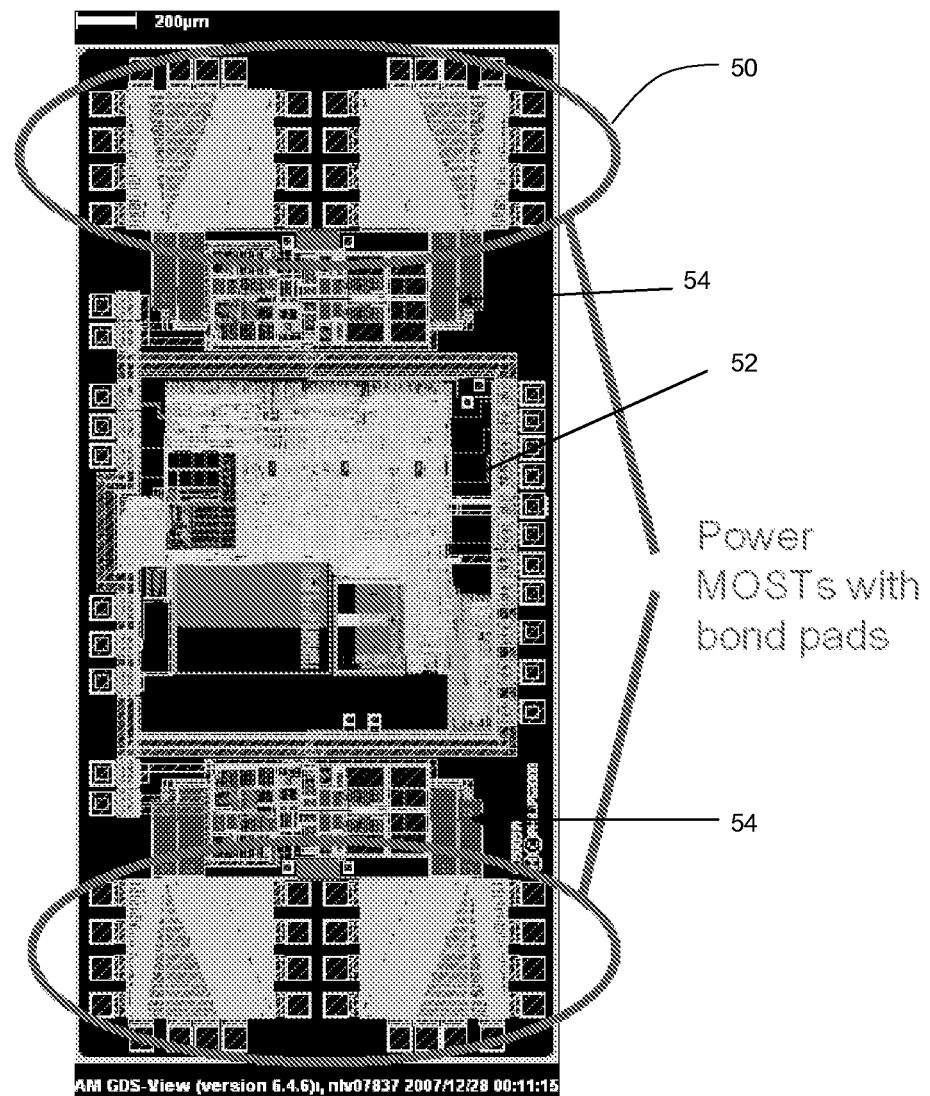
Figure 6:
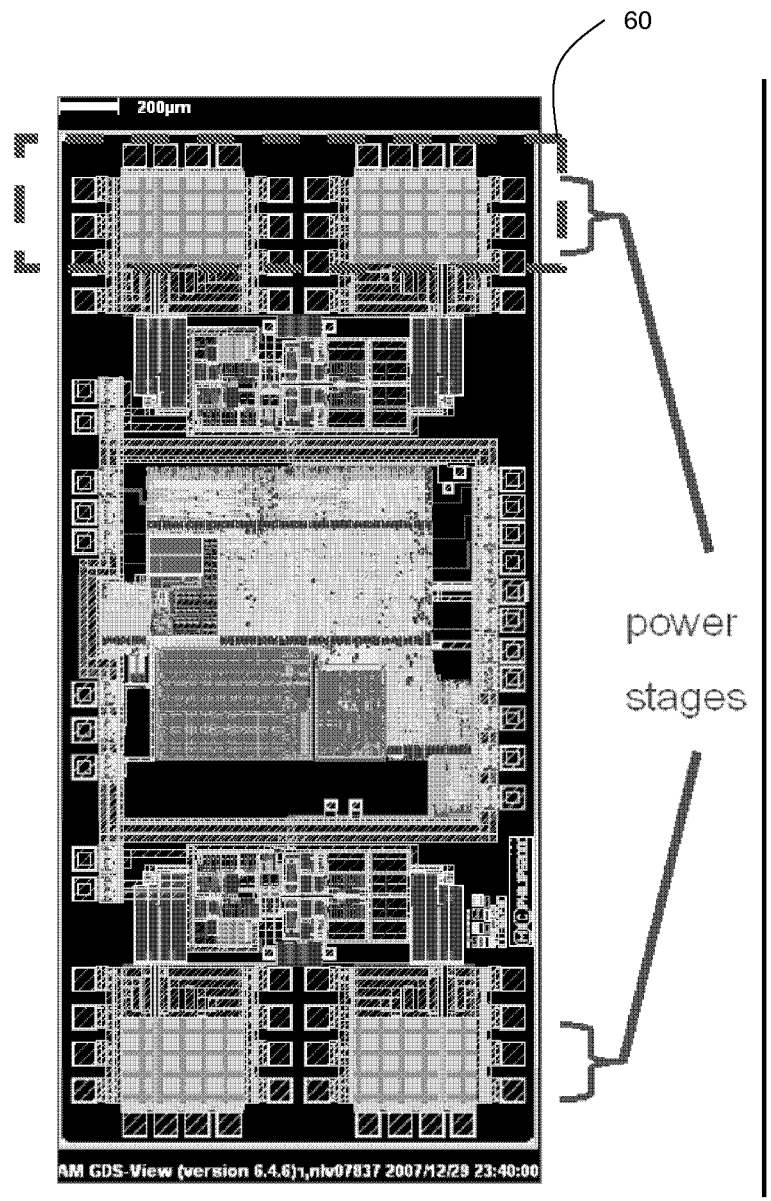

Embodiments of the invention are described in more detail and by way of non-limiting examples with reference to the accompanying drawings, wherein FIG. 1 schematically depicts an embodiment of a transistor layout of the IC of the present invention;

FIG. 2 schematically depicts the current flows in the transistor layout of FIG. 1;

FIG. 3 schematically depicts a metal grid for interconnecting the source regions of the transistor layout of FIG. 1;

FIG. 4 schematically depicts a metal grid for interconnecting the drain regions of the transistor layout of FIG. 1;

FIG. 5 shows a layout of an IC design using strip-based power CMOS transistors; and FIG. 6 shows a layout of an IC design using CMOS power transistors having the transistor layout of FIG. 1.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 1 depicts a layout of a transistor such as a power-MOS transistor in accordance with an embodiment of the present invention. In this layout, the source regions labeled S and the drain regions labeled D are laid out in a grid 1 such as a checkerboard pattern, with the source regions S and the drain regions D being separated by a grid of gate regions 14. The source, drain and gate regions may be formed in any suitable manner. For instance, the gate regions may be polysilicon gate regions, and may be insulated from the underlying channel region by means of an insulating material such as $SiO_2$ or a high-k dielectric material, which is a material having a higher dielectric constant than $SiO_2$.

The grid 1 is divided into a number of unit cells 10, which each comprise a number of N building blocks, wherein N is a positive integer having a value of at least four. The N building blocks comprise N−1 source and drain regions as well as a substrate contact 12 such that each unit cell facilitates the connection of a metal layer of the IC incorporating the grid 1. Such a substrate contact 12 is intended to be used to provide latch-up protection to the transistor but may also be used for other purposes, such as to provide a (back-) bias to the substrate. In case of a CMOS transistor, the substrate contact 12 will be located in the substrate of an nMOS (power) transistor, and will be located in the n-well of a pMOS (power) transistor to facilitate the necessary latch-up protection.

The size of unit cell is typically based on the number of substrate contacts 12 required to implement the desired functionality provided through these contacts. For instance, in case of latch-up protection for a power transistor in NXP's CMOS75 technology, which is a 0.35 micron twin-well 3.3 V CMOS technology, N has been calculated to be sixteen. However, for different technologies, e.g. different CMOS technologies, the value of N may be different. This may also depend on the functionality to be provided through the substrate contacts 12.

In FIG. 1, the unit cells 10 and the grid 1 are shown to have a square layout. This is by way of non-limiting example only. The unit cells 10 generally have dimensions of H*V=N wherein H is the number of building blocks in a horizontal direction and V is the number of building blocks in a vertical direction. H and V may have the same value, yielding a square building block 10 or different values, yielding a rectangular building block 10. Similarly, the grid 1 may also adopt a different shape, such as a rectangular shape or even a non-rectangular shape such as an L-shape or a U-shape for instance. Hence, the transistor layout of the present invention makes it possible to more effectively use the available silicon real estate, especially when the available real estate has an awkward, i.e. non-rectangular shape.

It will be appreciated that because the substrate can be contacted using vertical contacts, the number of contacts required to provide the substrate with effective latch-up protection can be reduced, thereby reducing the footprint of the transistor including its interconnect structures. This is particularly advantageous for transistors that have to handle large currents such as currents of 1 Ampere or more, i.e. power transistors, because such transistors require a very large gate effective width, e.g. in excess of $10^4$ micron, and consequently have a footprint that is several orders in magnitude larger than a digital logic transistor, such that large gains in the overall area of an IC can be achieved if the footprint of such a power transistor can be reduced. Such power transistors may for instance be used in audio power amplifiers, voltage regulators, voltage converters, RF amplifiers, bus line drivers and so on.

In FIG. 1, each unit cell 10 has its own grid of gate regions 14, with the respective gate grids being interconnected via bridging gate structures 16. In other words, the gate regions have been omitted around the substrate contacts 12. However, this gate grid arrangement is shown by way of non-limiting example only. Other arrangements, such as a single gate grid 14 for the checkerboard grid 1, in which the substrate contacts 12 are also surrounded by gate structures, may also be contemplated.

As is known from the prior art, a transistor layout based on an alternating grid of source and drain regions provides an area-efficient way of providing a transistor with a large effective channel width. This is because such an alternating grid comprises many parallel channels. This is demonstrated in FIG. 2, which shows a unit cell 10 of the grid 1 in more detail. The gate structure grid 14 defines where a current can flow between a drain region D and a source region S, as indicated by the arrows in FIG. 2.

A solid arrow identifies a current flow (or channel) inside the unit cell 10 whereas a dashed arrow identifies a current flow (or channel) shared between two neighboring unit cells 10. The unit cell 10 in FIG. 2 has an effective channel width of 28 units compared to 16 units for a prior art one-dimensional transistor based on parallel interdigited drain and source strips. The effective channel width may be obtained by counting the solid arrows as a single channel width unit and a dashed arrow as half channel width unit because it is shared with another unit cell. This clearly demonstrates the improvement in channel width per unit area for the checkerboard layout of FIG. 2. The unit cell 10 in FIG. 2 is surrounded by further unit cells 10 on all four edges. Obviously, for a unit cell 10 at the edge of the grid 1, the effective channel width will be slightly lower because not all four edges of the unit cell 10 have a channel extending to another unit cell.

A particularly advantageous aspect of the present invention is demonstrated in FIG. 3, in which an interconnect metal layer is depicted. The metal layer is the interconnect layer for the source regions S of the transistor layout of FIG. 1, as demonstrated in FIG. 3 by the dashed regions S under the metal portions 32. The actual interconnection between the dashed regions S and the metal portions 32 may be made in any suitable manner, e.g. using vias through one or more insulating layers (not shown) between the metal layer and the substrate. Since the design and formation of such interconnections is routine practice for the person skilled in the art, this will not be further explained for reasons of brevity only. The portions 32 may have the same shape as the underlying source regions, but may be larger in area than the source regions. The increase in area may facilitate a larger overlap between the respective metal portions 32 to reduce the resistance of the metal grid 30.

A key feature of the metal layer is that it is formed of interconnected metal portions such that a metal grid 30 is formed, which, due to the fact that the metal portions 32 are only partially interconnected, provides gaps 34 in between the metal portions 32 that facilitate underlying substrate structures to be connected through the metal grid 30. Preferably, the partial interconnections are realized by designing the metal grid 30 such that the shapes of the individual metal portions 32 partially overlap. It will be appreciated that this is not an overlap in the physical sense but an overlap in geometrical sense where multiple shapes are merged into a single shape (the metal grid 30) by such a partial overlap.

For instance, vias 36 may be provided in the gaps 32 over the drain regions D to connect the drain regions to a higher metal layer, and vias 38 may be provided to connect the substrate contacts 12 to a higher metal layer. Due to the overlap between the metal portions 32, the metal grid 30 still acts as a metal layer. The amount of overlap between the metal portions 32 may be varied based on the ohmic requirements of the metal grid 30.

The grid 30 of the present invention may be realized in any suitable conductive material, such as Al, Cu, salicided polysilicon or any other metal or metal alloy available in the technology of interest. In the context of the present invention, the phrase 'metal' is to include metal alloys and other conductive materials that show similar conductivity characteristics, e.g. salicided polysilicon.

A further advantage of the metal portions 32 compared to the metal strips used in the prior art interdigited power transistors is that the foot print of the metal portions 32 is sufficiently large to support the formation of vias such as stacked vias to higher metal layers thereon. This overcomes interconnection problems in the prior art one-dimensional interdigited transistors, where the metal strips over the interdigited source and drain regions were too small to allow the interconnection of these strips to higher metal layers using the relatively bulky stacked vias.

The formation of such stacked vias may be facilitated by the use of a second metal grid 40 for interconnecting the drain regions D, as shown in FIG. 4. The partially overlapping metal portions 42 are located over the drain regions D such that they can be connected to the drain regions through the gaps 34 in the first metal grid 30. The gaps 44 between the metal portions 42 in the second metal grid 40 are located over the metal portions 32 of the first metal grid 30 and can be used to interconnect these metal portions 32 to higher metal layers, e.g. using stacked vias 46. In the second metal grid 40, the metal portions 42 located over the substrate contacts 12 are omitted such that the substrate contacts 12 can be connected to a higher metal layer via the gaps 34 in the first metal grid 30 and the gaps provided by the omission of the metal portions 42 in the second metal grid 40.

The metal grids 30 and 40 may be considered to provide power interconnect planes to the underlying source and drain regions. Such planes are characterized by a much lower interconnect resistance than the prior art metal strip arrangements of the interdigited power transistors, thus providing a substantial improvement in power consumption compared to these prior art devices.

In FIGS. 3 and 4, the metal grids 30 and 40 are composed of partially overlapping square metal portions 32 and 42 respectively. It is however emphasized that the metal portions 32 and 42 have been shown as square metal portions by way of non-limiting example only. Other shapes, such as rectangular shapes or even non-rectangular shapes may also be contemplated to form the metal grids 30 and 40, as long as the gaps 34 and 44 can be provided using these alternative shapes for the metal portions 32 and 42.

It will be appreciated that the stacking order of the metal grids 30 and 40 in the IC of the present invention may be reversed without departing from the teachings of the present invention; instead of the first metal grid 30 for interconnecting the source regions S being located between the IC substrate and the second metal grid 40 for interconnecting the drain regions D, the second metal grid 40 may be located between the first metal grid 30 and the IC substrate. Moreover, it will be appreciated that the higher of the two metal layers may a conventional metal layer if the lower metal grid such as metal grid 30 in the discussed example does not require interconnection to a higher metal layer by means of vias such as stacked vias.

For the sake of clarity, it is pointed out that in the context of the present invention, 'lower' is intended to refer to a layer or grid closer to the substrate, i.e. the bottom of the IC, when considering the stack of layers forming the IC, and 'higher' is intended to refer to a layer or grid closer to the top of the IC when considering the stack of layers forming the IC.

It is further emphasized that the metal grids 30 and/or 40 may also be used in combination with alternating grids of source and drain regions only, in which the substrate contacts 12 are omitted. In this case, the second metal grid 40 will further comprise overlapping metal portions 42 in the areas of the metal grid 40 located over the substrate contacts 12 in FIG. 4. Although the benefit of the reduced number of substrate contacts required to provide effective latch-up protection is sacrificed in such a checkerboard-type arrangement of source and drain regions, such an IC still benefits from the fact that the interconnection of the source and drain regions in such an alternating grid can be more easily achieved, as previously discussed.

It will be appreciated that if one of the source or drain interconnection metal layers is the top metal layer in the metal layer stack of the IC of the present invention, there is no need for this metal layer to be shaped in the form of a metal grid 30 or 40 because such a metal layer does not have to facilitate connections of lower structures to a higher metal layer. In such a case, the relevant metal layer may be a continuous metal layer or another suitable metal layer known in the art.

It is further pointed out that the specific embodiment of the top metal layer of the IC of the present invention is not essential to this invention. Any suitable implementation of the top metal layer may be chosen. For instance, the top metal layer may carry a bump interconnection layer for connecting the top metal layer to e.g. another chip, a package or a component board. Alternatively, such a bump interconnection layer may also be provided in parallel with the top metal layer to reduce the resistance of the power plane. Many other suitable embodiments will be apparent to the skilled person.

FIG. 5 depicts an IC layout of a class-D stereo audio amplifier comprising a digital signal processing portion 52, analog circuitry 54 and prior art power MOS transistors 50 in an interdigited strip layout. FIG. 6 depicts an IC layout of the same class-D stereo audio amplifier in which the interdigited power MOS transistors 50 have been replaced with power MOS transistors 60 according to an embodiment of the present invention. It is clearly demonstrated that the power MOS transistors 60 according to an embodiment of the present invention provides a footprint reduction of almost 50% compared to the prior art power MOS transistors 50 in an interdigited strip layout.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising a substrate carrying at least one transistor comprising an alternating grid of source and drain regions separated by a grid of gate regions, wherein the respective source regions are vertically connected to a first metal layer and the respective drain regions are vertically connected to a second metal, at least one of the first metal layer and the second metal layer comprising a metal grid of a plurality of interconnected metal portions arranged such that said grid comprises a plurality of gaps for connecting respective substrate portions to a further metal layer; and wherein the grid comprises a plurality of unit cells, each unit cell comprising a grid of N building blocks, N being an integer having a value of at least four, said N building blocks comprising a single substrate contact and (N−1) source and drain regions, the source and drain regions of the unit cells being separated by at least a part of the grid of gate regions.

2. An integrated circuit according to claim 1, wherein each unit cell comprises source regions and drain regions.

3. An integrated circuit according to claim 1, wherein the substrate comprises a plurality of n-wells, and wherein the substrate contact of each unit cell is connected to one of said n-wells.

4. An integrated circuit according to claim 1, wherein each unit cell comprises a grid of gate regions, the gate region grids of the respective unit cells being interconnected.

5. An integrated circuit according to claim 1, wherein the first metal layer comprises the plurality of interconnected metal portions, and wherein the drain regions are connected to the second metal layer through the gaps in the first metal layer.

6. An integrated circuit according to claim 1, wherein each of a metal portion has a shape that is substantially similar to a corresponding source or drain region and an area that is larger than the area of the corresponding source or drain region.

7. An integrated circuit according to claim 1, further comprising a first low-ohmic metal layer conductively coupled to the first metal layer through at least one stacked via.

8. An integrated circuit according to claim 1, further comprising a second low-ohmic metal layer conductively coupled to the second metal layer through at least one stacked via.

9. An integrated circuit according to claim 1, wherein the at least one transistor is a CMOS transistor.

10. An integrated circuit according to claim 1, wherein the at least one transistor is a power transistor.

11. An electronic device comprising an integrated circuit according to claim 1.

12. A method of manufacturing an integrated circuit comprising at least one transistor formed on a substrate, said method comprising:
   providing a substrate carrying at least one transistor comprising a grid of source and drain regions separated by a grid of gate regions,
   providing a first metal layer such that the respective source regions are vertically connected to the first metal layer; and
   providing a second metal layer such that the respective drain regions are vertically connected to the second metal layer,
   wherein at least one of the first metal layer and the second metal layer comprises a metal grid comprising a plurality of interconnected metal portions arranged such that said metal grid comprises a plurality of gaps for connecting respective substrate portions to a further metal layer,
      wherein providing a substrate comprises providing a plurality of unit cells, each unit cell comprising a grid of N building blocks, N being an integer having a value of at least four, said N building blocks comprising a single substrate contact and source and drain regions, the source and drain regions of the unit cells being separated by at least a part of the grid of gate regions.

13. A method according to claim 12, wherein the first metal layer comprises the plurality of partially overlapping metal portions and wherein the first metal layer is located between the substrate and the second metal layer, the method further comprising the step of connecting the drain regions to the second metal layer through the gaps in the first metal layer.

* * * * *